(12) United States Patent
Bhattacharyya et al.

(10) Patent No.: US 7,768,062 B2
(45) Date of Patent: Aug. 3, 2010

(54) COMBINED VOLATILE AND NON-VOLATILE MEMORY DEVICE WITH GRADED COMPOSITION INSULATOR STACK

(75) Inventors: Arup Bhattacharyya, Essex Junction, VT (US); Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/422,580

(22) Filed: Apr. 13, 2009

(65) Prior Publication Data
US 2009/0200602 A1 Aug. 13, 2009

Related U.S. Application Data

(62) Division of application No. 11/210,539, filed on Aug. 24, 2005, now Pat. No. 7,525,149.

(51) Int. Cl.
*H01L 29/78* (2006.01)
(52) U.S. Cl. .............. 257/324; 257/325; 257/E29.304; 257/E29.309
(58) Field of Classification Search ................ 257/314, 257/315, 324, 325, E29.255, E29.304, E29.309
See application file for complete search history.

(56) References Cited

U.S. PATENT DOCUMENTS

| 4,336,603 | A | 6/1982 | Kotecha et al. |
|---|---|---|---|
| 4,870,470 | A | 9/1989 | Bass, Jr. et al. |
| 6,586,797 | B2 | 7/2003 | Forbes et al. |
| 2003/0048666 | A1 | 3/2003 | Eldridge et al. |
| 2003/0049900 | A1 | 3/2003 | Forbes et al. |
| 2006/0166452 | A1 | 7/2006 | Rao et al. |

OTHER PUBLICATIONS

X.B. Lu, et al., Synthesis and Memory Effect Study of Ge Nanocrystals Embedded in LaAlO$_3$ High-κDielectrics, Appl. Phys. Lett. 86, 203111, 2005, (3 pages).
C. Lee et al., Operational and Reliability Comparison of Discrete-Storage Nonvolatile Memories: Advantages of Single- and Double-Layer Metal Nanocrystals, IEDM, 2003, pp. 557-560.
J.J. Lee, et al., Novel Nonvolatile Memory Device using Metal Nanocrystals Embedded in High-K for Improved Data Retention, NV Workshop, 2004, 11.1-11.2.
Zhao, et al., Simulation of Hetero-nanocrystal Floating Gate Flash Memory, IEDM, 2004.

*Primary Examiner*—Sue Purvis
*Assistant Examiner*—Leslie Pilar Cruz
(74) *Attorney, Agent, or Firm*—Leffert Jay & Polglaze, P.A.

(57) ABSTRACT

A memory device is fabricated with a graded composition tunnel insulator layer. This layer is formed over a substrate with a drain and a source region. The tunnel insulator is comprised of a graded SiC—GeC—SiC composition. A charge blocking layer is formed over the tunnel insulator. A trapping layer of nano-crystals is formed in the charge blocking layer. In one embodiment, the charge blocking layer is comprised of germanium carbide and the nano-crystals are germanium. The thickness and/or composition of the tunnel insulator determines the functionality of the memory cell such as the volatility level and speed. A gate is formed over the charge blocking layer.

25 Claims, 11 Drawing Sheets

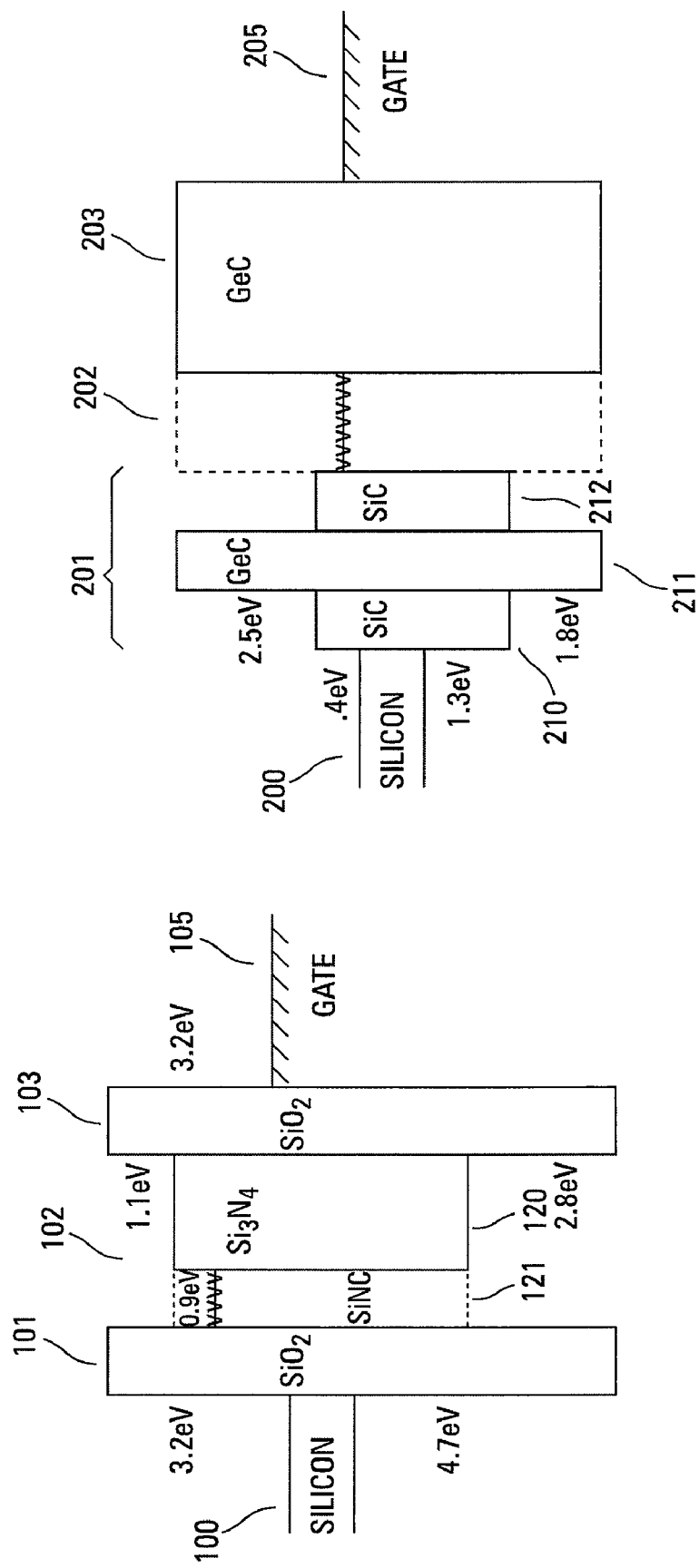

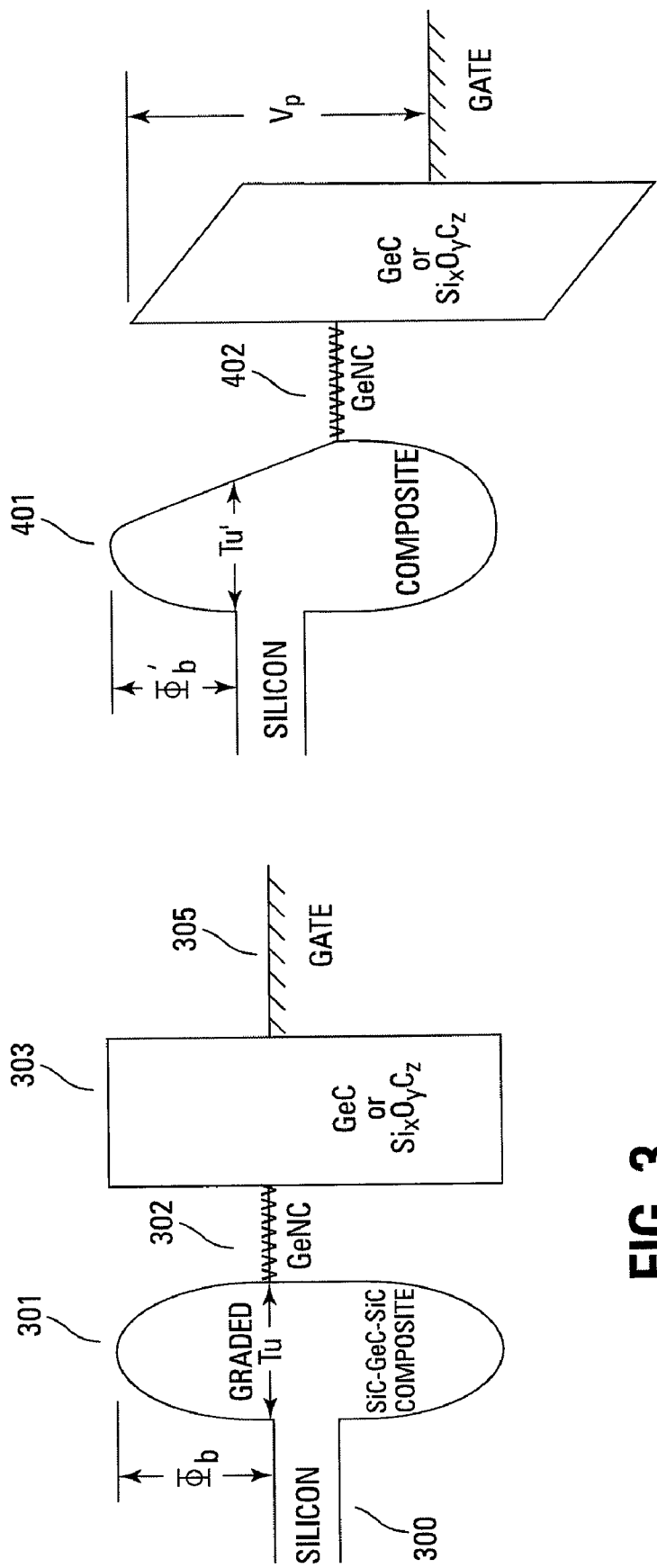

US 7,768,062 B2

COMBINED VOLATILE AND NON-VOLATILE MEMORY DEVICE WITH GRADED COMPOSITION INSULATOR STACK

CROSS REFERENCE TO RELATED APPLICATIONS

This is a Divisional Application of U.S. application Ser. No. 11/210,539, titled "COMBINED VOLATILE AND NON-VOLATILE MEMORY DEVICE WITH GRADED COMPOSITION INSULATOR STACK," filed Aug. 24, 2005, now U.S. Pat. No. 7,525,149, which application is assigned to the assignee of the present invention and the entire contents of which are incorporated herein by reference.

TECHNICAL FIELD OF THE INVENTION

The present invention relates generally to memory devices and in particular the present invention relates to DRAM and non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), non-volatile, floating gate NOR/NAND flash memory, and dynamic random access memory (DRAM).

Flash memories may use floating gate technology or trapping technology. Floating gate cells include source and drain regions that are laterally spaced apart to form an intermediate channel region. The source and drain regions are formed in a common horizontal plane of a silicon substrate. The floating gate, typically made of doped polysilicon, is disposed over the channel region and is electrically isolated from the other cell elements by oxide. The non-volatile memory function for the floating gate technology is created by the absence or presence of charge stored on the isolated floating gate.

The trapping technology functions as a non-volatile memory and can be implemented in a silicon-oxide-nitride-oxide-silicon (SONOS) architecture. The nitride trap layer can capture and store electrons or holes in order to act as a non-volatile memory.

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors, such as rate of charge dissipation in the memory capacitor, but is typically in the range of milliseconds.

Computers, cell phones, and many other hand-held electronic devices employ several types of the above memories for working memory and data storage. These memories require custom technologies that are typically not compatible to each other due to different cell design, fabrication techniques, and material characteristics. Consequently, the different memories are produced on different silicon substrates to minimize cost and maximize product yield.

Both DRAM and floating gate flash consume relatively high power compared to other memory technologies. DRAM requires frequent refreshing to maintain the data integrity while flash memory requires on-chip high voltage/current for programming and erase operations.

Another problem with these technologies is scalability. The DRAM has capacitor scalability problems while the flash has voltage and coupling noise scalability problems. Additionally, with progressive scaling of feature size, fundamental device leakage issues such as short-channel effects and gate dielectric leakage will need to be contained in order to take advantage of scaling.

For the reasons stated above, and for other reasons stated below that will become apparent to those skilled in the art upon reading and understanding the present specification, there is a need in the art for low power, scalable, multifunctional memory cells.

BRIEF DESCRIPTION OF THE DRAWINGS

FIG. 1 shows an energy band diagram of a typical prior art SONOS structure at flatband.

FIG. 2 shows an energy band diagram of a discrete tunnel layer structure of the present invention at flatband.

FIG. 3 shows an energy band diagram of one embodiment of a memory cell of the present invention at flatband having a graded tunnel layer composite structure.

FIG. 4 shows an energy band diagram of the embodiment of FIG. 3 under a bias condition.

DETAILED DESCRIPTION

Figure 6:
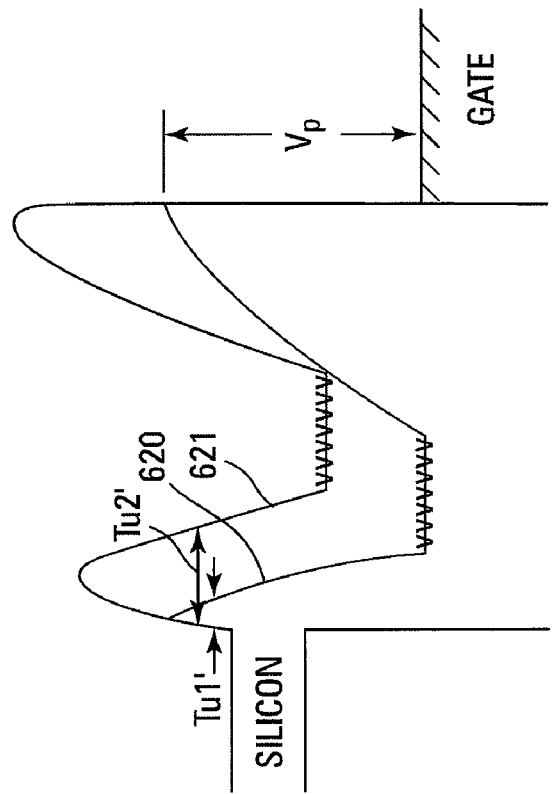
FIG. 6 shows an energy band diagram of the system of FIG. 5 under a bias condition.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

FIG. 1 illustrates an energy band diagram of typical prior art silicon-oxide-nitride-oxide layers of a SONOS structure at flatband with silicon nano-crystals formed in the trapping layer. Flatband conditions exist when no charge is present in the semiconductor so that the silicon energy band is flat. It is assumed that this occurs at zero gate bias (neglecting the work-function difference between the gate electrode and silicon).

The illustrated structure is comprised of the silicon substrate 100, the oxide-nitride-oxide 101, 102, 103 (ONO) layer, and the control gate 105. The illustrated tunnel oxide 101 has a physical thickness of approximately 4 nm and the charge blocking oxide 103 has a thickness of approximately 6 nm. The charge trapping layer 102 is comprised of silicon nitride ($Si_3N_4$) with approximately 3 nm of silicon nano-crystals (SiNC) 121 nearest the tunnel insulator 101. Another portion 120 of the charge trapping layer 102 does not have the nano-crystals.

SONOS and nano-crystal types of non-volatile memory devices are typically referred to as discrete trap or embedded trap devices. The charge to be stored in the nitride trap layer 102 tunnels through the $SiO_2$ tunnel insulator 101 and is confined to the charge trapping layer 102, and more so to the nano-crystal layer 121, and is retained due to the charge blocking insulator layer 103 providing the energy barrier. The tunneling may be accomplished by direct and Fowler-Nordheim tunneling during write operations while holes tunnel by direct tunneling during erase operations.

Stored charge retention and erase speed sensitivity can depend on the tunneling distance (i.e., tunnel insulator thickness). For example, an increase in oxide insulator thickness from an EOT of 1 nm to 3 nm would result in a charge retention increase of approximately five orders of magnitude but also reducing the erase speed by nearly the same amount. This is due to the fact that both the back-tunneling electron current as well as the forward hole current are dependent on tunneling distance that in turn depends on the insulator thickness, given the large band energy barriers ($\Phi_b$) of oxide of 3.2 eV for electrons and 4.7 eV for holes (with reference to silicon), respectively. The tunnel oxide 101 has a band gap energy $E_b$ of approximately 9 eV, the nitride layer 102 has a band gap energy $E_b$ of approximately 5.1 eV, and the charge blocking oxide has a band gap energy $E_b$ of approximately 9 eV.

The band diagram of FIG. 1 also shows that the Schottky barrier height ($\Phi_b$) is 3.2 eV for electrons. $\Phi_b$ is the tunneling barrier for electron conduction across the interface and, therefore, is of importance to the successful operation of any semiconductor device. The magnitude of $\Phi_b$ for electrons reflects the mismatch in the energy position of the conduction band edge of the silicon substrate 100 and the oxide tunnel insulator 101.

FIG. 2 illustrates an energy band diagram of a discrete, multi-layer tunnel layer structure of the present invention at flatband. This structure is comprised of a silicon substrate 200, a multi-layer tunnel insulator 201, a germanium nano-crystal (GeNC) charge trapping layer 202, a germanium carbide charge blocking layer 203, and the polysilicon control gate 205.

The discrete tunnel insulator 201 is comprised of a GeC layer 211 sandwiched between two SiC layers 210, 212. The insulator 201 is approximately 6 nm thick. The silicon carbide layers 201, 212 have an $E_b$ of 2.8 eV while the germanium carbide layer 211 has an $E_b$ of 7.1 eV.

The charge trapping layer 202 is comprised of approximately 4-5 nm of Ge nano-crystals embedded in GeC. The charge blocking layer 203 portion of the GeC is approximately 10 nm thick.

FIG. 3 illustrates an energy band diagram of one embodiment of a memory cell of the present invention at flatband having a graded tunnel layer composite structure. This memory cell embodiment is comprised of the substrate 300, the graded composite tunnel layer structure 301, the trapping layer 302, the charge blocking layer 303, and the control gate 305.

In one embodiment, the substrate 300 is comprised of silicon. Alternate embodiments may use other materials.

The graded composite tunnel layer 301, in one embodiment, is comprised of a SiC—GeC—SiC composition. This is accomplished by starting with the silicon carbide and slowly building up the amount of germanium carbide and reducing the amount of silicon carbide until the structure is a very thin layer of all germanium carbide at the middle portion of the composite. The amount of germanium carbide is then slowly reduced and the amount of silicon carbide increased until the maximum amount of silicon carbide is again reached at the thickest end of the composite. The tunnel layer 301 has an illustrated thickness of Tu.

The energy band gap of the tunnel layer 301 thus changes from the 2.8 eV of SiC and slowly increases with the increased amount of GeC until the energy band is the 7.1 eV $E_b$ of GeC at the middle and then gradually decreases to 2.8 eV again at the thickest end. The energy band of the tunnel layer 301 is therefore elliptical in nature. At its maximum at the middle, the energy barrier height is $\Phi_b$ (=7.1 eV, in FIG. 3).

The memory cell fabrication continues with a layer of germanium carbide 302 plus 303 and the control gate 305 that, in one embodiment, is a polysilicon material. The germanium carbide is then embedded with germanium nano-crystals (GeNC) 302 to generate the trapping layer 302. In one embodiment, the GeNC trapping layer 302 is approximately 4-5 nm thick while the GeC charge blocking layer 303 is approximately 10 nm thick.

In an alternate embodiment, the charge blocking layer 303 can be comprised of $Si_xO_yC_z$ by adding oxygen to SiC. The more oxygen that is added, the more the energy band gap is increased. For example, SiC has a band gap of 2.8 eV while $SiO_2$ has a band gap of 9 eV. Therefore, the band gap of the alternate embodiment can be increased from 2.8 eV to 9 eV by increasing the oxygen content. This characteristic can be used to make the $Si_xO_yC_z$ look like GeC by increasing the amount of oxygen until the band gap reaches the 7.1 eV of GeC.

Being able to tailor the energy band gap of this layer 303 provides the capability of changing its function. For example, the illustrated embodiment uses this layer 303 as the charge blocking layer and, therefore, needs a high band gap such as that of GeC or $SiO_2$. In an alternate embodiment (e.g., reverse mode), this layer may be used as the tunneling layer whereby a lower band gap may be needed. In such a case, the interface between this layer 303 and the gate 305 may be a silicon carbide only with no oxygen component in order to achieve a reduction in the band gap at the gate-insulator interface.

The germanium nano-crystal trapping layer 302 is used due to its superior trapping characteristics of electrons as compared to silicon nano-crystals. This gives the illustrated embodiment of FIG. 3 many orders of magnitude better retention than the typical prior art memory cells using silicon nano-crystals.

FIG. 4 illustrates an energy band diagram of the embodiment of FIG. 3 with a bias condition of $V_p$ on the gate. The resulting field distorts the ellipsoid shape of the tunnel layer 401 energy band. The effective thickness of the tunnel layer 401 is reduced to Tu'. The effective barrier height is also reduced to $\Phi_b'$. This increases, by many orders of magnitude, the speed of the transport of the electrons through the tunnel layer 401 to be trapped in the germanium nano-crystal trapping layer 402.

Figure 5:
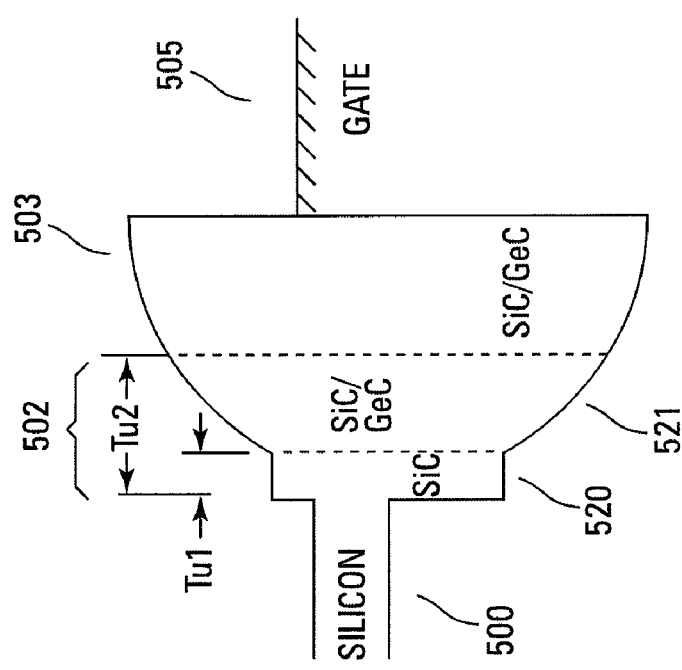
FIG. 5 shows an energy band diagram of another embodiment of the graded composition insulator stack of the present invention.

FIG. 5 illustrates an energy band diagram of another embodiment at flatband of the graded composition insulator stack of the present invention. This embodiment is comprised of a silicon substrate 500, a SiC layer 520, a graded Si—Ge—C composite layer 503, and a polysilicon gate 505.

The Ge nano-crystals, in this example, are embedded at two different locations from the silicon substrate/insulator interface. In a DRAM embodiment, the trapping layer is formed closer to the substrate at a distance of Tu1 which comprises only the SiC layer and the first Ge nano-crystal layer is embedded at the interface between the SiC layer and the composite. The shorter tunnel distance Tu1 is in a direct tunneling regime, thus providing faster write and erase times but also reducing the retention time as compared to a non-volatile memory. In one embodiment, Tu1 is only 2 nm from the silicon/insulator interface. Since this trapping location is in SiC, electrons tunneling into this region face the barrier energy of SiC only.

In a non-volatile memory, the trapping layer is formed further from the substrate at a distance of Tu2 within the graded layer composite. In this embodiment, the germanium nano-crystals are embedded in the composite SiC/GeC layer 521 at distance Tu2. The longer tunnel distance is a Fowler-Nordheim tunneling regime, thus requiring slower write/ erase times but also increasing the retention time as compared to the DRAM embodiment. In one embodiment, Tu2 is 5 nm from the silicon/insulator interface. Additionally, the barrier energy for electrons trapping in this region is higher and corresponds to the composite composition of SiC/GeC mix.

Beyond the Tu2 thickness, the GeC content of the composite mix increases until at the maximum thickness, the composition is 100% GeC interfacing the gate with a band gap of 7.1 eV. This prevents charge loss to the gate since the high barrier of the remaining composite acts as a charge blocking layer. The embodiment of FIG. 5 achieves simultaneous DRAM and non-volatile memory functionality in substantially similar device structures using the same technology.

FIG. 6 illustrates an energy band diagram of the embodiment of FIG. 5 under a bias condition of $V_p$. It can be seen that the bias reduces the Tu1 distance 620 to Tu1'. This is the distance 620 for the DRAM embodiment. The Tu2 distance 621 is reduced to Tu2'. This distance is the non-volatile memory embodiment.

Figure 7:
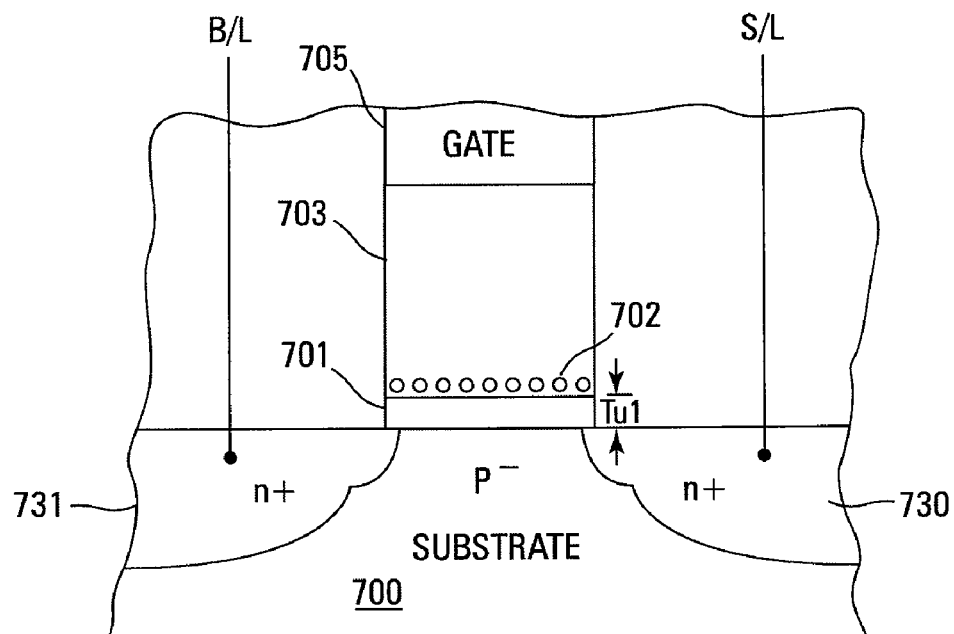
FIG. 7 shows a cross-sectional view of one embodiment of a field effect transistor DRAM cell with the graded composition insulator stack of the present invention.

FIG. 7 illustrates a cross-sectional view of one embodiment of the field effect transistor DRAM memory cell with the graded composition insulator stack of the present invention. This figure shows the substrate 700 with the implanted drain 731 and source 730 regions. The bit line B/L is connected to the drain region 731 and the common source line S/L is connected to the source region 730. Alternate embodiments may switch the functionality of these regions 730, 731 in response to different direction of operation of the transistor. For example, biasing the transistor in one direction may make the right implanted region a drain region and the left implanted region a source region.

In one embodiment, the substrate 700 is a p–doped silicon and the drain and source regions 731, 730 are n+ regions. Alternate embodiments can use alternate conductivity doping.

The graded, composite tunnel layer 701 is formed over the substrate substantially between the drain and source regions 731, 730. As disclosed previously, the graded, composite tunnel layer 701 is comprised, in one embodiment, of SiC/ GeC/SiC composite wherein the ratio of GeC to SiC increases as the middle of the layer 701 is increased then decreases as the top of the layer 701 is reached. Therefore, the middle of the tunnel layer 701 comprises the maximum amount of GeC and the minimum amount of SiC while the outer portions of the layer 701 contain the maximum amount of SiC and the minimum amount of GeC.

The embodiment of FIG. 7 illustrates a DRAM memory cell. In this embodiment, the tunnel layer 701 is thinner and has a thickness of Tu1. As will be seen subsequently, this is significantly less than the Tu2 thickness of the non-volatile memory device of FIG. 8. In one embodiment, Tu1 is 3 μm. Alternate embodiments can use other thicknesses.

The charge blocking layer 703 is formed over the graded, composite tunnel insulator layer 701. The charge blocking layer 703 employs implanted germanium nano-crystals 702 in a layer above the tunnel insulator 701. Thus, by varying the thickness Tu of the tunnel insulator, the carrier transport speed through the tunnel layer 701 and the retention time of the trap layer 702 is changed. Since the Tu1 distance of FIG. 7 is less than the Tu2 distance of FIG. 8, the carrier transport speed of FIG. 7 will be greater than that of FIG. 8 while the charge retention will be less.

A gate 705 is formed over the charge blocking layer 703. In one embodiment, the gate is formed from a polysilicon material. However, alternate embodiments can use other materials such as a metal.

Figure 8:
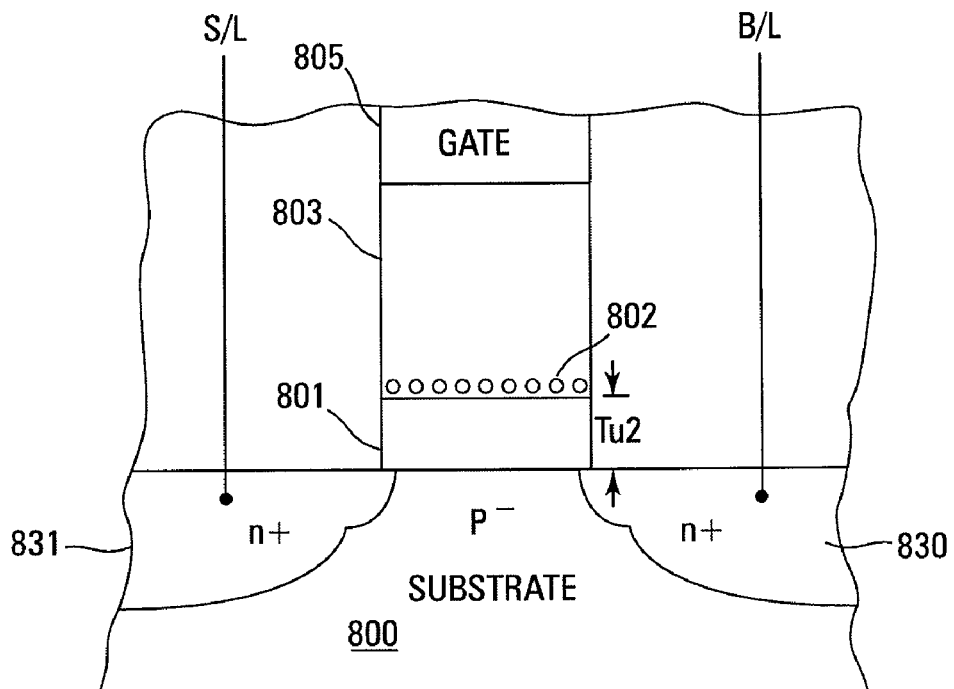
FIG. 8 shows a cross-sectional view of one embodiment of a field effect transistor non-volatile memory cell with the graded composition insulator stack of the present invention.

FIG. 8 illustrates a cross-sectional view of one embodiment of the field effect transistor non-volatile memory cell with the graded composition insulator stack of the present invention. This figure shows the substrate 800 with the implanted drain 831 and source 830 regions. The bit line B/L is connected to the drain region 831 and the common source line S/L is connected to the source region 830. Alternate embodiments may switch the functionality of these regions 830, 831 in response to different direction of operation of the transistor. For example, biasing the transistor in one direction may make the right implanted region a drain region and the left implanted region a source region.

In one embodiment, the substrate 800 is a p– doped silicon and the drain and source regions 831, 830 are n+ regions. Alternate embodiments can use alternate conductivity doping.

The graded, composite tunnel layer 801 is formed over the substrate substantially between the drain and source regions 831, 830. As disclosed previously, the graded, composite tunnel layer 801 is comprised, in one embodiment, of SiC/GeC/SiC composite wherein the ratio of GeC to SiC increases to its maximum value at the middle of the layer 801 and then decreases to its minimum value as the top of the layer 801 is reached. In this embodiment, since Tu2 is greater than Tu1, the GeC content is higher for the non-volatile memory cell compared to the DRAM cell and consequently provides larger barrier energy thus further enhancing charge retention.

The charge blocking layer 803 is formed over the graded, composite tunnel insulator layer 801. The charge blocking layer 803 employs implanted germanium nano-crystals 802 in a layer above the tunnel insulator 801. Since the Tu2 distance of FIG. 8 is greater than the Tu1 distance of FIG. 7, the carrier transport speed of FIG. 8 will be less than that of FIG. 7 while the charge retention will be greater. In one embodiment Tu2 is 5 nm. Alternate embodiments can use other thicknesses.

A gate 805 is formed over the charge blocking layer 803. In one embodiment, the gate is formed from a polysilicon material. However, alternate embodiments can use other materials such as a metal.

Figure 9:
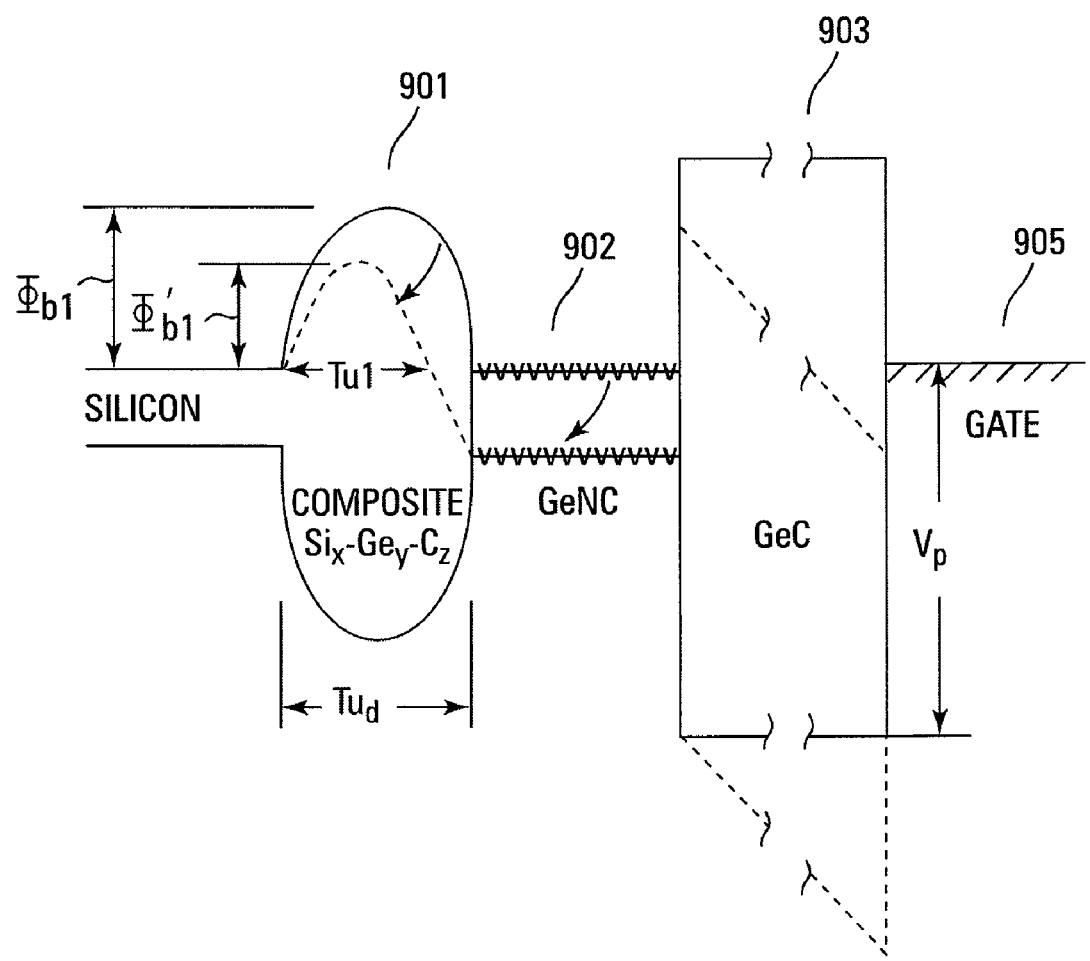
FIG. 9 shows an energy band diagram of a DRAM cell of the present invention before bias and under a bias condition.

FIG. 9 illustrates an energy band diagram of a DRAM cell, under a bias condition, with a composite tunnel insulator layer of the present invention. In this embodiment, the tunnel insulator layer 901 is comprised of a graded Si—GeC—Si composite with a physical thickness of $Tu_d$. In one embodiment, $Tu_d$ is 3 nm. Alternate embodiments can use other thicknesses. The tunnel insulator 901 has an energy barrier height at flatband of $\Phi_{b1}$.

The trap layer 902 is comprised of GeC embedded with germanium nano-crystals. The charge blocking layer 903 is germanium carbide 903 having a thickness of 10 nm. Alternate embodiments can use other thicknesses.

The gate 905 has a bias of $V_p$. The resulting electric field causes the graded, composite tunnel dielectric 901 to have a lower barrier height $\Phi_{b1}'$ and a shorter barrier distance of Tu1.

Figure 10:
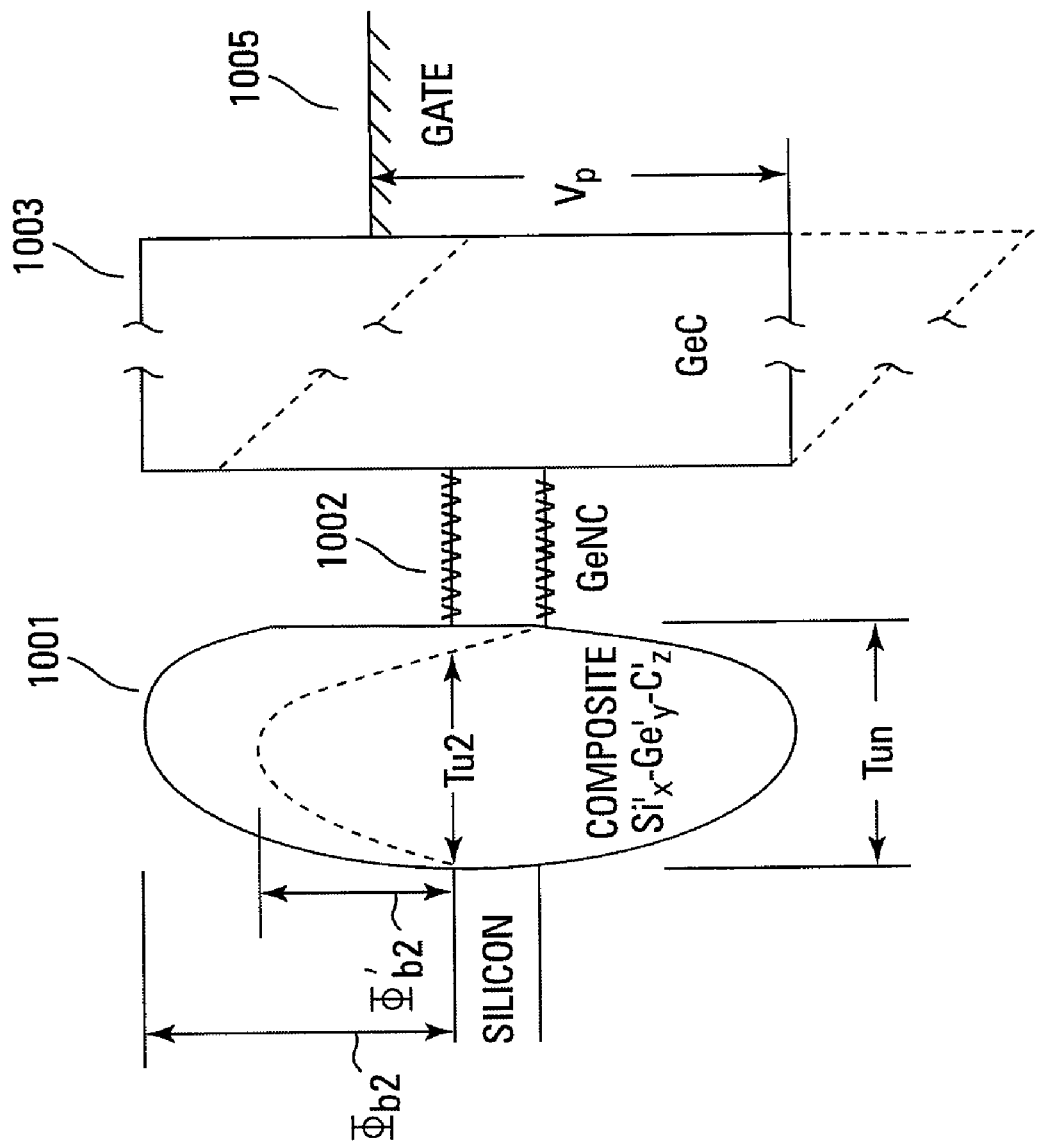
FIG. 10 shows a band diagram of a non-volatile memory cell before bias and under a bias condition.

FIG. 10 illustrates an energy band diagram of a non-volatile memory cell, under a bias condition, with a composite tunnel insulator layer of the present invention. In this embodiment, the tunnel insulator layer 1001 is comprised of a graded Si—GeC—Si composite with a physical thickness of $Tu_n$. In one embodiment, $Tu_n$ is 5 nm. Alternate embodiments can use other thicknesses. The tunnel insulator 1001 has an energy barrier height at flatband of $\Phi_{b2}$. It should be noted that $\Phi_{b2}$ is significantly greater than $\Phi_{b1}$ of FIG. 9 due to the difference in composition of the composite of FIG. 10 at the center of the composite when compared with the DRAM embodiment of FIG. 9.

The trap layer 1002 is comprised of GeC with embedded germanium nano-crystals. The charge blocking layer 1003 is germanium carbide 1003 having a thickness of 10 nm. Alternate embodiments can use other thicknesses.

The gate 1005 has a bias of $V_p$. The resulting electric field causes the graded, composite tunnel dielectric 1001 to have a lower barrier height $\Phi_{b2}'$ and a shorter barrier distance of Tu2. It should be noted that both $\Phi_{b2}'$ and Tu2 are greater than $\Phi_{b1}'$ and Tu1 of FIG. 9.

Figure 11:
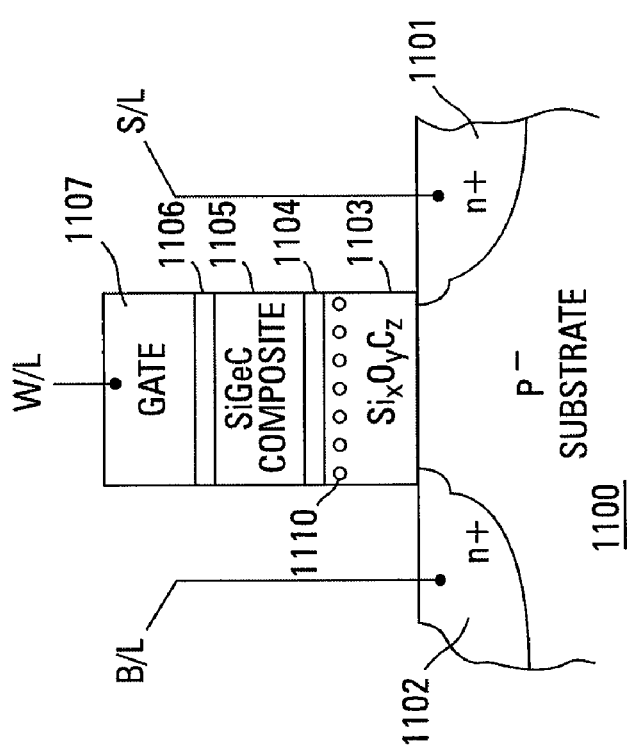
FIG. 11 shows a schematic cross-sectional view of one embodiment of a reverse mode DRAM and non-volatile memory cell with a graded composition insulator stack of the present invention.

FIG. 11 illustrates a schematic cross-sectional view of one embodiment of a reverse mode DRAM and non-volatile memory cell with a graded composition insulator stack of the present invention. In this embodiment, electrons are injected from the gate instead of the silicon substrate as done in a normal mode device.

The reverse mode embodiment is comprised of a substrate 1100 having a plurality of implanted source/drain regions. In the illustrated embodiment, the right region is a source region 1101 and the left region is a drain region 1102. The source region 1101 is connected to a common source line S/L while the drain region is coupled to a bit line B/L. In one embodiment, the substrate is a p-type substrate. As in previous embodiments, the function of each active area 1101, 1102 may change depending on the direction of operation of the transistor.

A charge blocking layer 1103 is formed over the substrate 1100. In one embodiment, the charge blocking layer is comprised of $Si_xO_yC_z$ as described previously. The charge trap layer 1110 is comprised of a layer of Ge nano-crystals formed in the upper portion of the charge blocking layer 1103.

The composite insulator layer 1105 is formed over the charge blocking layer 1103 with either side of the layer 1105 having a thin layer of SiC 1104, 1106. The composite insulator layer 1105 is comprised of a graded composite of SiGeC.

The polysilicon gate 1107 is formed over the SiC 1106 layer of the tunnel insulator layer 1105. The memory array word line W/L is connected to the gates of each memory cell in an array.

The functionality of the transistor of FIG. 11 can be changed from DRAM to non-volatile memory cell by changing the energy barrier height as discussed previously. For example, the $\Phi_b$ of a DRAM cell might be $\Phi_{b1}$ while the non-volatile memory cell has a $\Phi_{b2}$ barrier height, where $\Phi_{b1} < \Phi_{b2}$.

Figure 12:
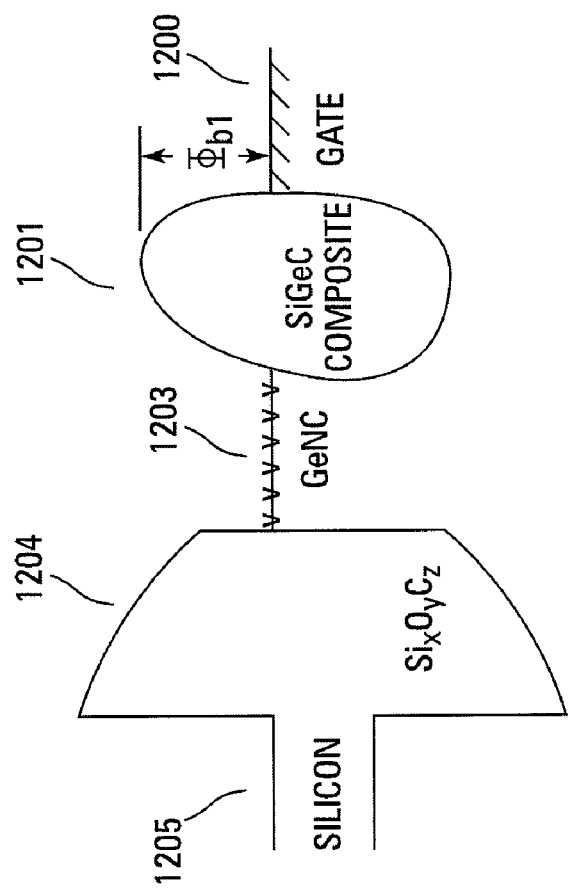
FIG. 12 shows an energy band diagram of the reverse mode DRAM embodiment of FIG. 11 at flatband.

FIG. 12 illustrates an energy band diagram of the reverse mode DRAM embodiment of FIG. 11 at flatband condition. The graded composite insulator layer 1201 has an energy barrier height of $\Phi_{b1}$ so that electrons injected from the gate 1200 have an increased speed in reaching the trapping layer 1203 of Ge nano-crystals. The charge blocking layer 1204 that is formed over the substrate 1205 keeps the charge from leaking to the substrate 1205.

The peak ratio of GeC/SiC for the DRAM embodiment of FIG. 12 is set to R1. This is the rate or gradient of composition of the insulator layer 1201. This ratio will be discussed subsequently with reference to FIG. 13.

Figure 13:
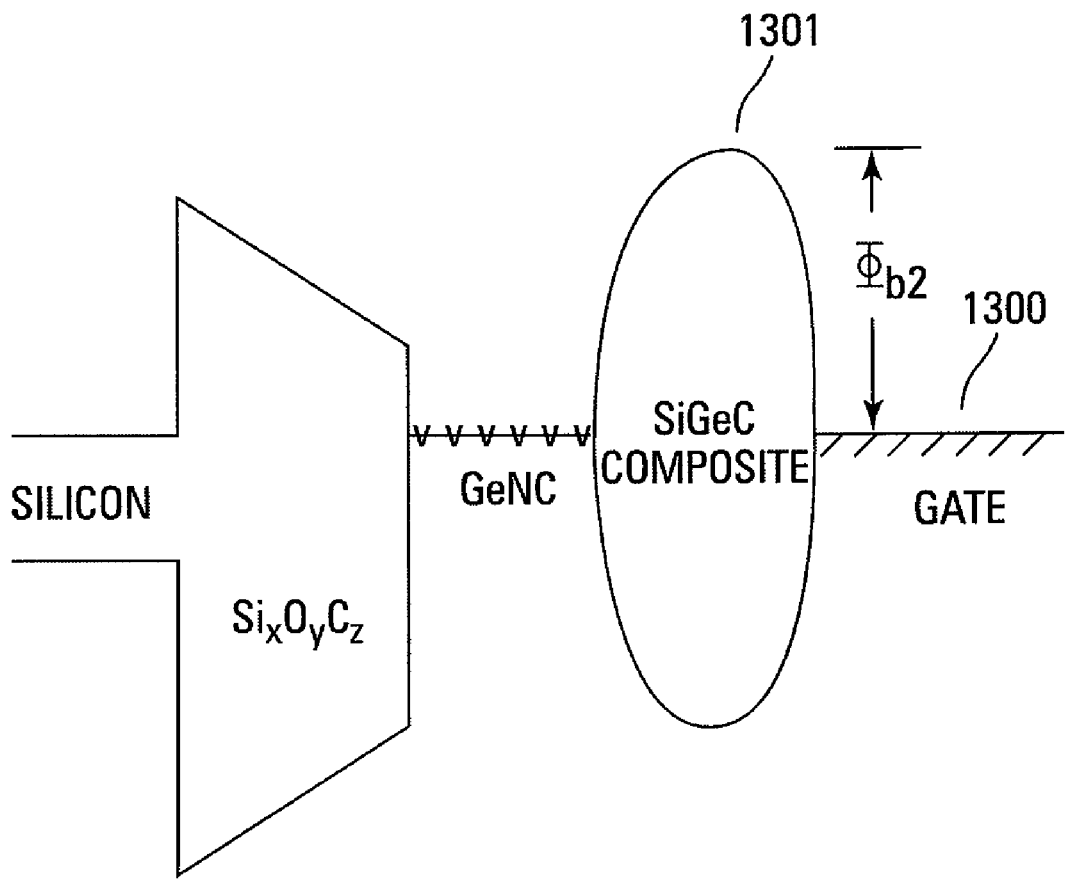
FIG. 13 shows an energy band diagram of the reverse mode non-volatile memory cell embodiment of FIG. 11 at flatband.

FIG. 13 illustrates an energy band diagram of the reverse mode non-volatile memory cell embodiment of FIG. 11 at flatband condition. This embodiment is substantially similar to the embodiment of FIG. 12 except that the composite tunnel insulator layer 1301 has higher energy barrier height of $\Phi_{b2}$ between the gate 1300 and the insulator 1301. Since this embodiment is a non-volatile memory cell that has a longer retention time than the DRAM of FIG. 12, $\Phi_{b2}$ is greater than $\Phi_{b1}$ of the DRAM.

The peak ratio of GeC/SiC for the non-volatile memory cell of FIG. 13 is set to R2. This establishes the rate or gradient of composition of the insulator layer 1301. When the non-volatile memory cell embodiment of FIG. 13 is compared to the DRAM cell of FIG. 12, R2>R1. This means that for the same thickness of insulator layer 1201, 1301 for these figures, an increase in the gradient (i.e., rate of increase of GeC with respect to SiC) will increase the level of non-volatility of the memory cell. In other words, by modulating the gradient of the insulator layer without changing the thickness, the level of non-volatility of a memory cell can be changed.

Figure 14:
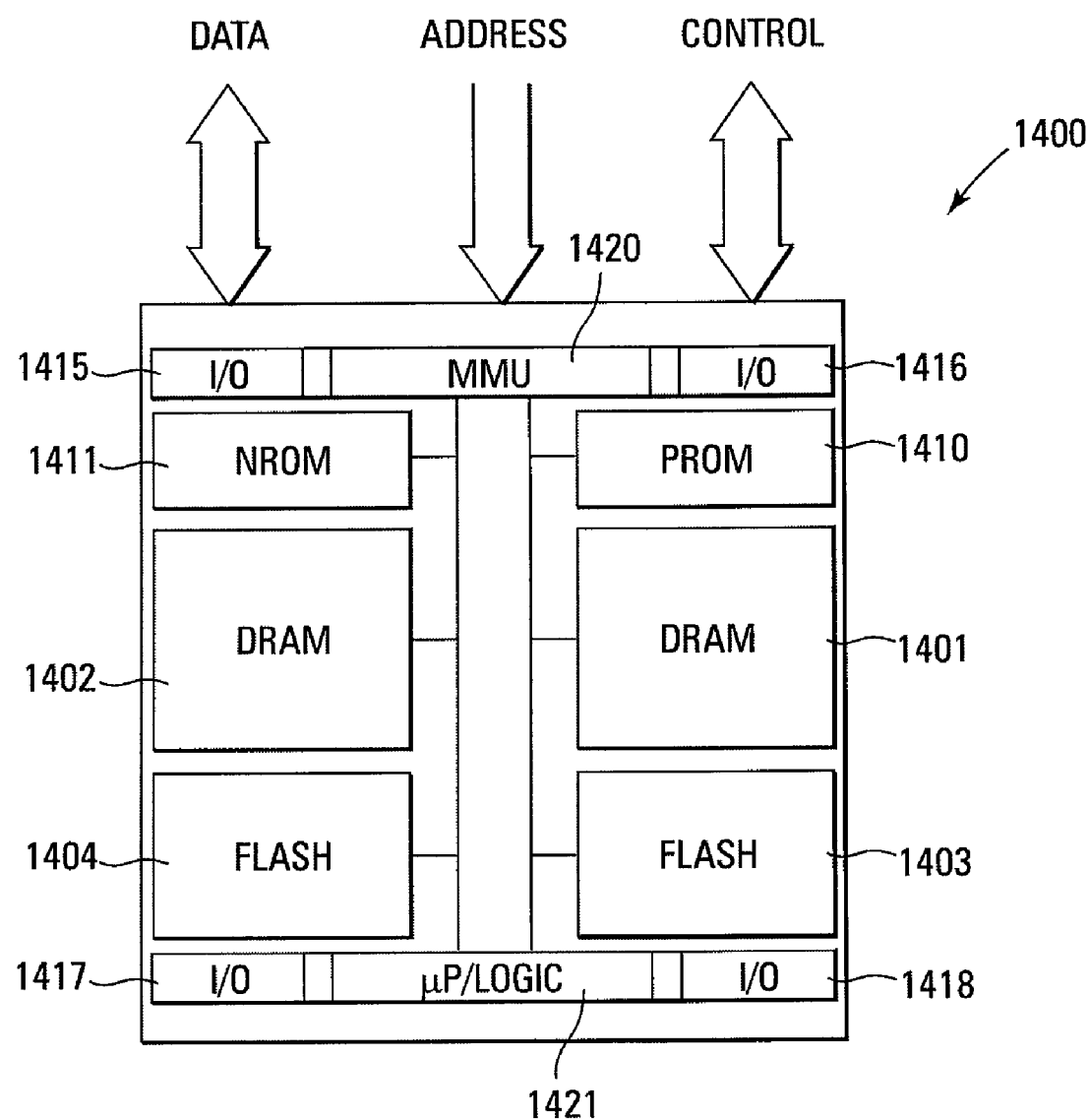
FIG. 14 shows a block diagram of one embodiment of a chip architecture of a memory system incorporating the memory cell embodiments of the present invention.

FIG. 14 illustrates a functional block diagram of a single chip controller/memory system device 1400 that can incorporate the non-volatile memory and DRAM cells of the present invention. The fabrication techniques of the above-described structures allow these different memory technologies to be fabricated on a single chip.

The embodiment of FIG. 14 is for purposes of illustration only. The NROM/PROM/flash/DRAM cells of the present invention can be incorporated in any integrated circuit. The memory cells can also be configured in any array configuration including NOR, NAND, AND or other architectures.

The memory system 1400 is comprised of two capacitor-less DRAM arrays 1401, 1402, two flash memory arrays 1403, 1404, a PROM array 1410, and an NROM array 1411. Each of these memory arrays is constructed using the memory cells described previously.

The system can further contain various input/output (I/O) ports 1415-1418 that can be coupled to outside signals such as data, address, and control buses. A memory management unit (MMU) 1420 can be used to control access to each of the memory blocks 1401-1404, 1410, 1411 for both external access by another processor or by an internal microprocessor/control logic 1421.

Figure 15:
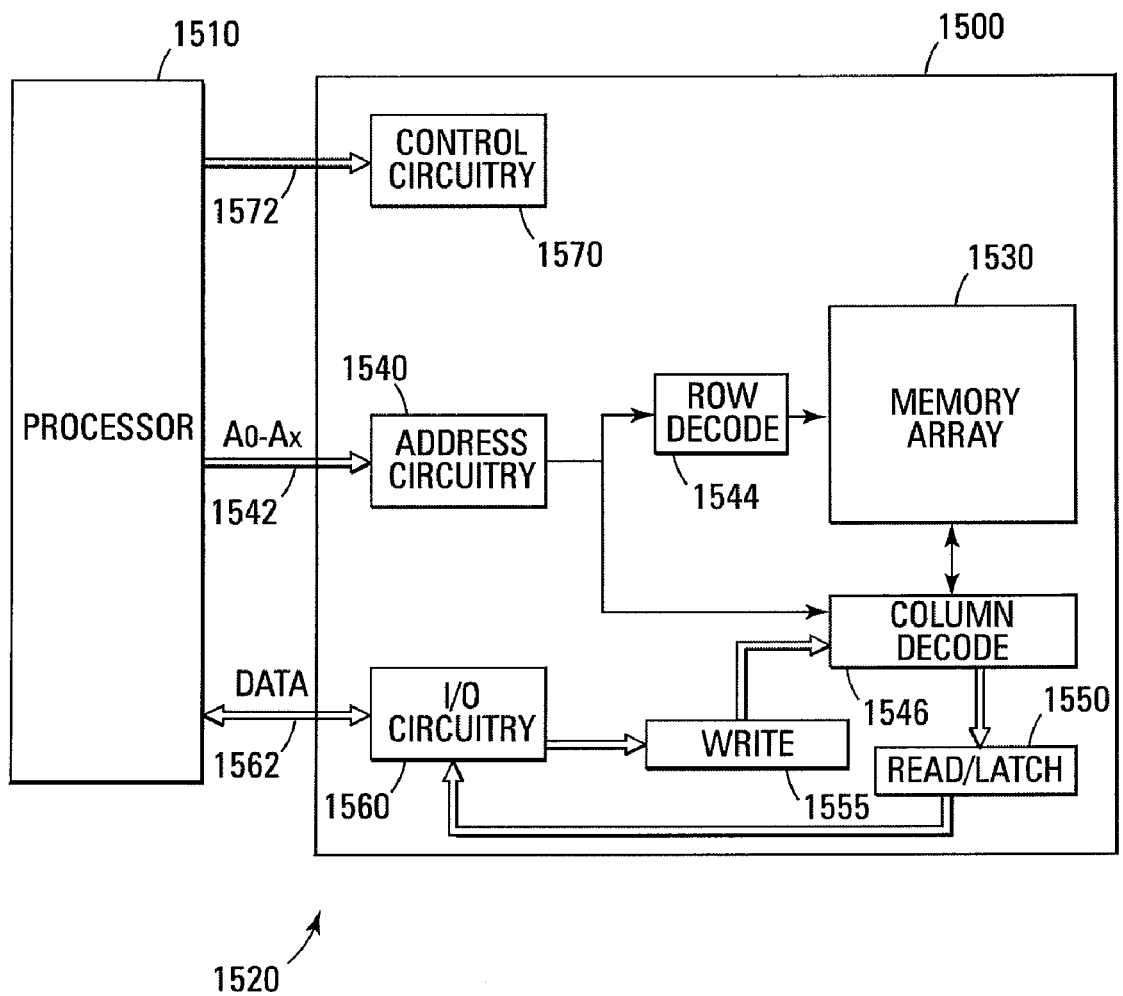
FIG. 15 shows a block diagram of a memory device incorporating the memory cell embodiments of the present invention.

FIG. 15 illustrates a functional block diagram of a memory device 1500 of one embodiment of the present invention. The memory device 1500 has been simplified to focus on features of the memory that are helpful in understanding the present invention.

The memory device includes an array of memory cells 1530 as discussed previously. The memory cells can be DRAM type memory cells, non-volatile memory cells or a combination of both. The memory array 1530 is arranged in banks of rows and columns along word lines and bit lines, respectively.

An address buffer circuit 1540 is provided to latch address signals provided on address input connections A0-Ax 1542. Address signals are received and decoded by a row decoder 1544 and a column decoder 1546 to access the memory array 1530. It will be appreciated by those skilled in the art, with the benefit of the present description, that the number of address input connections depends on the density and architecture of the memory array 1530. That is, the number of addresses increases with both increased memory cell counts and increased bank and block counts.

The memory device 1500 reads data in the memory array 1530 by sensing voltage or current changes in the memory array columns using sense/latch circuitry 1550. The sense/latch circuitry, in one embodiment, is coupled to read and latch a row of data from the memory array 1530. Data input and output buffer circuitry 1560 is included for bi-directional data communication over a plurality of data connections 1562 with the controller 1510. Write circuitry 1555 is provided to write data to the memory array.

Control circuitry 1570 decodes signals provided on control connections 1572 from the processor 1510. These signals are used to control the operations on the memory array 1530, including data read, data write, and erase operations. In one embodiment, the control circuitry 1570 executes the embodiments of the memory cell row remapping and erasing of the present invention. The control circuitry 1570 may be a state machine, a sequencer, or some other type of controller.

The flash memory device illustrated in FIG. 15 has been simplified to facilitate a basic understanding of the features of the memory. A more detailed understanding of internal circuitry and functions of flash memories are known to those skilled in the art.

Figure 16:
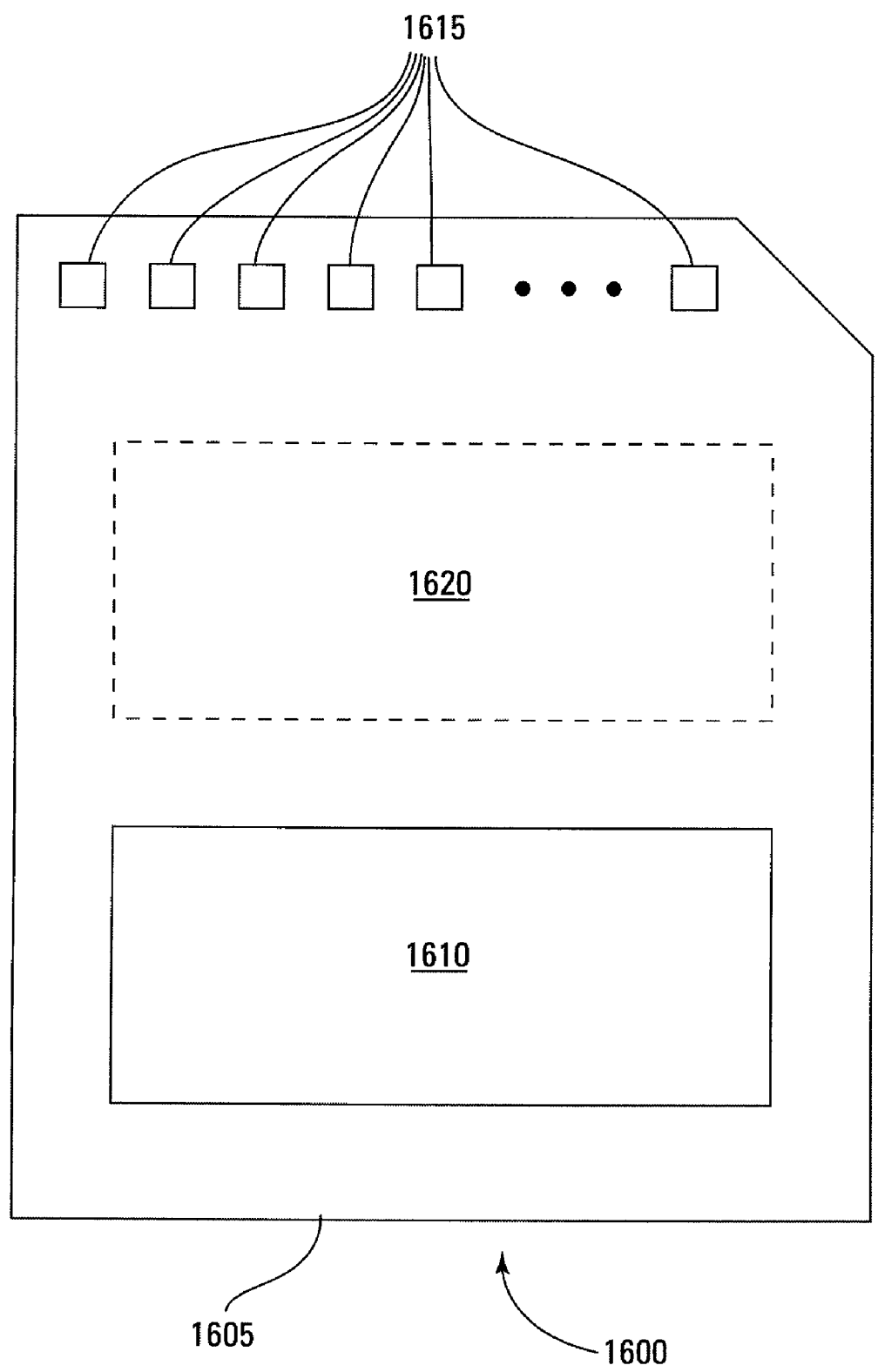
FIG. 16 shows a block diagram of one embodiment of a memory module incorporating the memory cell embodiments of the present invention.

FIG. 16 is an illustration of a memory module 1600 that incorporates the memory cell embodiments as discussed previously. Although memory module 1600 is illustrated as a memory card, the concepts discussed with reference to memory module 1600 are applicable to other types of removable or portable memory, e.g., USB flash drives. In addition, although one example form factor is depicted in FIG. 16, these concepts are applicable to other form factors as well.

Memory module 1600 includes a housing 1605 to enclose one or more memory devices 1610 of the present invention. The housing 1605 includes one or more contacts 1615 for communication with a host device. Examples of host devices include digital cameras, digital recording and playback devices, PDAs, personal computers, memory card readers, interface hubs and the like. For some embodiment, the contacts 1615 are in the form of a standardized interface. For example, with a USB flash drive, the contacts 1615 might be in the form of a USB Type-A male connector. For some embodiments, the contacts 1615 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1615 provide an interface for passing control, address and/or data signals between the memory module 1600 and a host having compatible receptors for the contacts 1615.

The memory module 1600 may optionally include additional circuitry 1620. For some embodiments, the additional circuitry 1620 may include a memory controller for controlling access across multiple memory devices 1610 and/or for providing a translation layer between an external host and a memory device 1610. For example, there may not be a one-to-one correspondence between the number of contacts 1615 and a number of I/O connections to the one or more memory devices 1610. Thus, a memory controller could selectively couple an I/O connection (not shown in FIG. 16) of a memory device 1610 to receive the appropriate signal at the appropriate I/O connection at the appropriate time or to provide the appropriate signal at the appropriate contact 1615 at the appropriate time. Similarly, the communication protocol between a host and the memory module 1600 may be different than what is required for access of a memory device 1610. A memory controller could then translate the command sequences received from a host into the appropriate command sequences to achieve the desired access to the memory device 1610. Such translation may further include changes in signal voltage levels in addition to command sequences.

The additional circuitry 1620 may further include functionality unrelated to control of a memory device 1610. The additional circuitry 1620 may include circuitry to restrict read or write access to the memory module 1600, such as password protection, biometrics or the like. The additional circuitry 1620 may include circuitry to indicate a status of the memory module 1600. For example, the additional circuitry 1620 may include functionality to determine whether power is being supplied to the memory module 1600 and whether the memory module 1600 is currently being accessed, and to display an indication of its status, such as a solid light while powered and a flashing light while being accessed. The additional circuitry 1620 may further include passive devices, such as decoupling capacitors to help regulate power requirements within the memory module 1600.

CONCLUSION

In summary, the memory cells of the present invention have graded, composite tunnel layers that provide multiple functionality, such as DRAM, flash, PROM, and others, in a single memory device. Memory arrays that are comprised of these cells can be integrated into a single piece of silicon substrate with similar device and gate stack features. The memory's functionality can be altered by changing the thickness and/or composition of the tunnel insulator and customizing the materials of the insulator and trapping layers. For example, for the same thickness of insulator, just changing the gradient of the insulator composition can change the level of volatility of the device. The gate stack materials and fabrication scheme for a DRAM and a non-volatile memory array are substantially identical resulting in less costly fabrication.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory cell comprising:
   a substrate having a drain region and a source region;
   a charge blocking layer formed over the substrate, the charge blocking layer comprising $Si_xO_yC_z$ and having a charge trapping layer comprised of nano-crystals;
   a first silicon carbide layer formed over the charge blocking layer;
   a tunnel insulator layer comprising a graded composite SiGeC and formed over the first silicon carbide layer;
   a second silicon carbide layer formed over the charge blocking layer; and
   a gate formed over the charge blocking layer.

2. The memory cell of claim 1 wherein the cell operates in a reverse mode such that electrons are transported from the gate through the tunnel insulator to the trapping layer.

3. The memory cell of claim 1 wherein the nano-crystals are Ge nano-crystals.

4. The memory cell of claim 1 wherein the cell is one of a flash memory, a DRAM, an NROM, or a PROM in response to a distance of the trapping layer from the gate.

5. The memory cell of claim 1 wherein the cell is one of a flash memory, a DRAM, an NROM, or a PROM in response to the gradation of graded composite SiGeC layer.

6. The memory cell of claim 1 wherein the nano-crystals are formed in an upper portion of the charge blocking layer.

7. The memory cell of claim 1 wherein each of the drain region and the source region comprises n+ type material and the substrate comprises p− type material.

8. The memory cell of claim 1 wherein the gate comprises polysilicon.

9. The memory cell of claim 1 wherein the graded composite SiGeC layer comprises SiC and GeC.

10. The memory cell of claim 9 wherein the SiC and the GeC of the graded composite SiGeC layer is formed having a first ratio of GeC to SiC at a first edge of the tunnel insulator layer, a second ratio of GeC to SiC at a middle portion of the tunnel insulator layer and a third ratio of GeC to SiC at a second edge of the tunnel insulator layer where the first edge is nearest the first silicon carbide layer and the second edge is nearest the second silicon carbide layer.

11. The memory cell of claim 10 wherein the ratio of GeC to SiC at the middle portion of the tunnel insulator layer corresponds to a thin layer comprised of only GeC.

12. The memory cell of claim 10 wherein the tunnel insulator layer comprises SiC at the first edge and the second edge, an increasing concentration of GeC and a reduction in concentration of SiC the nearer the center of the tunnel insulator layer where the tunnel insulator layer comprises substantially only GeC at the center of the tunnel insulator layer.

13. The memory cell of claim 10 where in the second ratio is greater than the first ratio and the third ratio.

14. The memory cell of claim 13 wherein the first ratio and the third ratio are substantially equal.

15. The memory cell of claim 10 wherein the memory cell is one of a volatile and a non-volatile memory cell.

16. The memory cell of claim 15 wherein the volatility of the memory cell is determined by a rate of change of gradient in the ratio of GeC to SiC across the graded composite SiGeC layer.

17. The memory cell of claim 16 wherein an increase in gradient in the ratio of GeC to SiC corresponds to a reduction in volatility of the memory device.

18. The memory cell of claim 16 wherein an energy barrier height of the graded composite SiGeC layer is determined by a rate of change of gradient in the ratio of GeC to SiC across the graded composite SiGeC layer.

19. The memory cell of claim 18 wherein a higher energy barrier height of the graded composite SiGeC layer corresponds to an increase in non-volatility of the memory cell.

20. A memory cell comprising:
    a substrate having a drain region and a source region;
    a charge blocking layer formed over the substrate, the charge blocking layer comprising $Si_xO_yC_z$ and having a charge trapping layer comprised of nano-crystals;
    a first silicon carbide layer formed over the charge blocking layer;
    a tunnel insulator layer comprising a graded composite SiGeC and formed over the first silicon carbide layer;
    a second silicon carbide layer formed over the charge blocking layer; and
    a gate formed over the charge blocking layer; and
    wherein the memory cell is configured to inject electrons from the gate into the charge trapping layer.

21. The memory cell of claim 20 wherein the charge trapping layer is formed in an upper portion of the charge blocking layer where the upper portion of the charge blocking layer is nearest the first silicon carbide layer formed over the charge blocking layer.

22. A memory device comprising:
    control circuitry that controls operation of the memory device; and
    one or more memory arrays, each memory array comprising:
    a plurality of memory cells formed in a substrate, each memory cell comprising:
    a drain and a source region formed in the substrate;

a charge blocking layer formed over the substrate, the charge blocking layer comprising $Si_xO_yC_z$ and having a charge trapping layer comprised of nanocrystals;

a first SiC layer formed over the charge blocking layer;

a tunnel insulator layer formed over the first SiC layer, the tunnel insulator comprising a graded composite of silicon carbide and germanium carbide;

a second SiC layer formed over the tunnel insulator layer; and a gate formed over the second SiC layer.

23. The memory device of claim 22 wherein the memory device further comprises input/output circuitry.

24. The memory device of claim 22 wherein the one or more memory arrays comprises a plurality of memory arrays where the plurality of memory arrays comprise one or more of a DRAM configured memory array and one or more of a non-volatile configured memory array.

25. The memory device of claim 22 wherein the control circuitry is configured to inject electrons from the gate through the second SiC layer, the tunnel insulator layer, the first SiC layer and into the charge trapping layer.

* * * * *